United States Patent [19]

Watanabe et al.

[11] Patent Number: 5,571,750
[45] Date of Patent: *Nov. 5, 1996

[54] METHOD FOR PRODUCING A SEMICONDUCTOR LASER DEVICE

[75] Inventors: Masanori Watanabe, Nara; Ken Ohbayashi, Tenri; Kazuaki Sasaki, Yao; Osumu Yamamoto, Nara; Mitsuhiro Matsumoto, Tenri, all of Japan

[73] Assignee: Sharp Kabushiki Kaisha, Osaka, Japan

[*] Notice: The term of this patent shall not extend beyond the expiration date of Pat. No. 5,413,956.

[21] Appl. No.: 314,585

[22] Filed: Sep. 28, 1994

Related U.S. Application Data

[63] Continuation of Ser. No. 995,064, Dec. 22, 1992, Pat. No. 5,413,956.

[30] Foreign Application Priority Data

Mar. 4, 1992 [JP] Japan ................. 4-46975
Mar. 4, 1992 [JP] Japan ................. 4-46976

[51] Int. Cl.$^6$ ........................................... H01L 21/20
[52] U.S. Cl. ................ 437/129; 437/948; 148/DIG. 143
[58] Field of Search ...................... 437/129, 948; 148/DIG. 143

[56] References Cited

U.S. PATENT DOCUMENTS

| | | |
|---|---|---|
| 4,230,997 | 10/1980 | Hartman et al. . |
| 4,563,368 | 1/1986 | Tihanyi et al. . |
| 4,839,308 | 6/1989 | Fye . |
| 4,910,166 | 3/1990 | Dholakia . |
| 4,985,370 | 1/1991 | Ponjee et al. . |
| 5,026,660 | 6/1991 | Dutt et al. ............... 148/D. 143 |
| 5,171,706 | 12/1992 | Matsumoto et al. . |
| 5,228,047 | 7/1993 | Matsumoto et al. . |

FOREIGN PATENT DOCUMENTS 0450902  10/1991  European Pat. Off. .
74292  6/1977  Japan .
27474  7/1980  Japan .
231885  12/1984  Japan .

OTHER PUBLICATIONS

*Patent Abstracts of Japan*, vol. 14, No. 354, (E–958) Jul. 31, 1990, Abstract of publication JP–A–02 123 782.
*Patent Abstracts of Japan*, vol. 9, No. 230, (E–343) Sep. 17, 1985, Abstract of publication JP–A–60 085 586.
*Patent Abstracts of Japan*, vol. 13, No. 266, (E–763) May 25, 1989, Abstract of publication JP–A–01 033 987.
*Patent Abstracts of Japan*, vol. 13, No. 147, (E–741) Apr. 11, 1989, Abstract of publication JP–A–63 308 997.
*Patent Abstracts of Japan*, vol. 13, No. 264, (E–774) Jun. 19, 1989, Abstract of publication JP–A–01 055 891.
*Patent Abstracts of Japan*, vol. 11, No. 61, (E–483) Feb. 25, 1987, Abstract of publication JP–A–61 220 390.
*Patent Abstracts of Japan*, vol. 16, No. 79, (E–1171) Feb. 26, 1992, Abstract of publication JP–A–03 268 382.

(List continued on next page.)

Primary Examiner—Robert Kunemund
Attorney, Agent, or Firm—Morrison & Foerster

[57] ABSTRACT

A method for producing a semiconductor laser device includes the steps of: forming window layers on either one of a top surface of an internal structure or a reverse surface of a substrate and on light-emitting end facets of the internal structure; forming a reflection film on the light-emitting end facets; removing the window layer formed on either one of the top surface or the reverse surface by using an etchant which hardly etches the reflection film; and forming electrodes on the surface from which the window layer is removed by etching and on the other surface. Another method for producing a semiconductor laser device includes the steps of: forming window layers on light-emitting end facets of the bars; inserting the bars into an apparatus having openings for forming electrodes and a supporting portion for preventing a positional shift between the bars and the openings, and forming the electrodes on the top surfaces and the reverse surfaces of the bars; and cutting the bars into the chips.

9 Claims, 11 Drawing Sheets

OTHER PUBLICATIONS

*Patent Abstracts of Japan*, vol. 10, No. 325, (E–451) Nov. 6, 1986, Abstract of publication JP–A–61 131 583.

Sasaki, K., et al. "Realization of highly reliable high–power operation of single–stripe AlGaAs lasers by the formation of window grown facets," *Japanese Journal of Applied Physics, Supplements*. Extended Abstracts International Conference on Solid State Devices and Materials, Yokohama, Japan, Aug. 27, 1991.

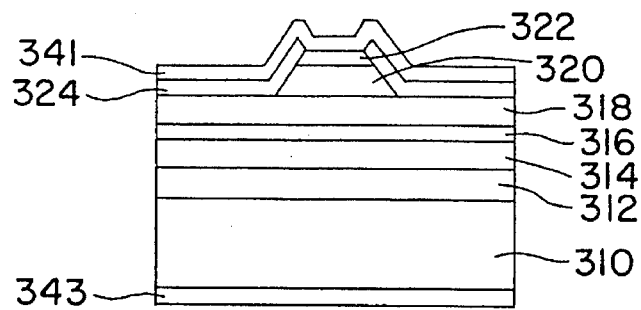
FIG. 11
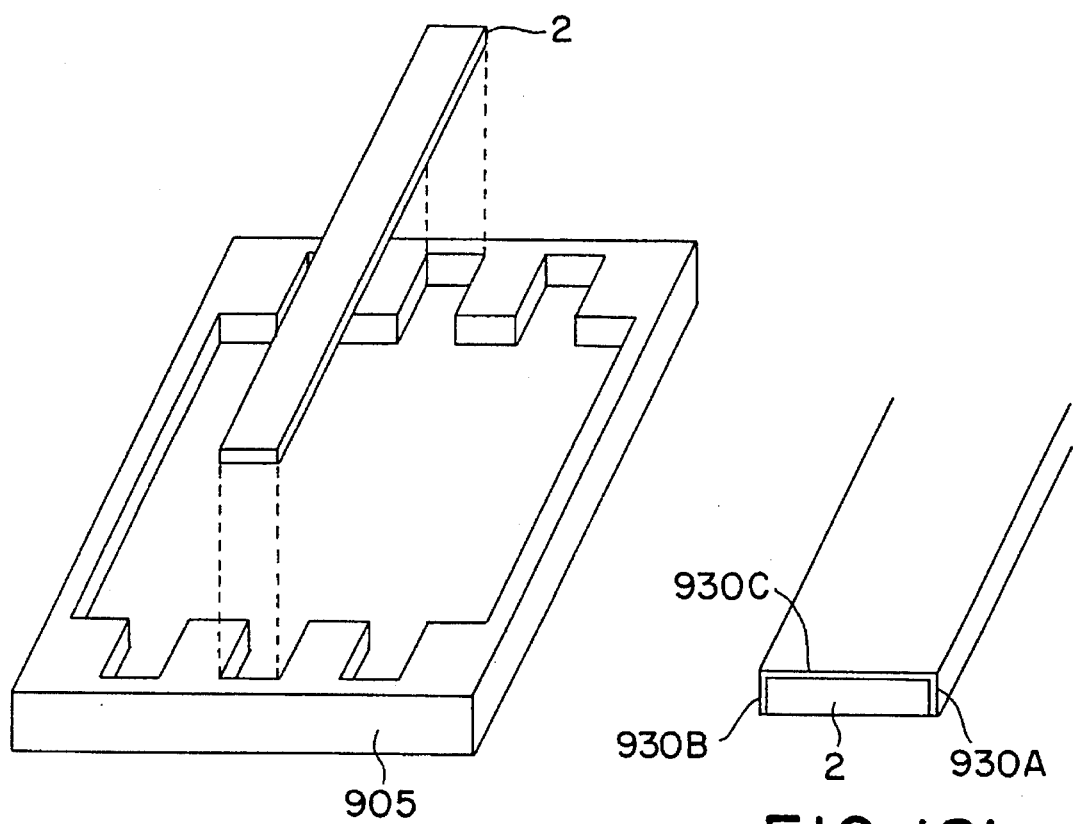
FIG. 12a
PRIOR ART
FIG. 12b
PRIOR ART

METHOD FOR PRODUCING A SEMICONDUCTOR LASER DEVICE

This application is a continuation of application Ser. No. 07/995,064 filed Dec. 22, 1992, now U.S. Pat. No. 5,413,956.

BACKGROUND OF THE INVENTION

1. Field of the Invention

The present invention relates to methods for producing semiconductor laser devices, in particular, high-output semiconductor laser devices which are used for optical disks, the generation of second harmonics, the oscillation of solid-state lasers, laser beam printers, the oscillation of optical fiber amplifiers, optical communications, laser beam processing, and laser treatments.

2. Description of the Related Art

In recent years, semiconductor laser devices having such advantages as small size, high efficiency, low cost, etc., have been put to practical uses, and thereby applied to general industrial and consumer appliances in which a laser beam source had been difficult to use in the past. The semiconductor laser devices having these advantages are expected to be used for the formation of high-speed optical disks, the effective generation of second harmonics and solid-state laser beams, the formation of high-speed laser printers, the extension of a relay distance and the formation of high-speed transmission in optical communication systems using optical fiber amplifiers, the formation of remarkably compact laser beam machines and laser treatment machines by making it possible to operate the semiconductor laser devices having these advantages at a high output power level.

However, the semiconductor laser devices as mentioned above have a problem such that the light-emitting end facets are damaged due to high optical density when the devices are operated at a high output power level. In order to overcome this problem, the following methods are known to be effective:

(1) reducing the optical density of the light-emitting end facets by extending the stripe width of a laser oscillation waveguide, (2) reducing the optical density of the light-emitting end facets by extending the light in the vertical direction toward the stripe width direction of the laser oscillation waveguide, (3) forming a current non-injection region in the vicinity of the light-emitting end facets, and (4) forming semiconductor layers which are lattice-matched with an internal semiconductor crystal and have a wider band gap than an active layer in the vicinity of the light-emitting end facets, whereby an interface state generating at the light-emitting end facets is removed to make them light non-absorption layers.

A semiconductor laser device with a high output laser beam may be prepared by combining these methods.

One example of the methods (4) comprises forming the light-emitting end facets by a cleavage or etching technique, and then forming very thin light non-adsorption layers (hereinafter, referred to as windows layers) on the light-emitting end facets. According to this method, when a waveguide light inside the device is reflected on the light-emitting end facet and bound to a waveguide again, there is little loss of light caused by the diffusion on the window layer. Thus, there is an advantage that the laser beam has hardly deteriorated oscillation efficiency compared to the case where no window layer is formed.

The window layers can be formed by the molecular beam epitaxy (MBE) method, or chemical vapor deposition methods such as the metal organic chemical vapor deposition (MOCVD) method.

However, because of the high degree of vacuum and the lack of the crystal growth beyond each facet in the MBE method, it is necessary to form separately the window layer at the front and back facets. On the other hand, because of the low degree of vacuum and the presence of the crystal growth beyond each facet in the MOCVD method, it is possible to form the window layer at the front and back facets, simultaneously.

An example of growing window layers on light-emitting end facets by the above-mentioned MOCVD method is shown in FIG. 12a. First, a wafer with an internal structure (layered structure) including an active region is cleaved to form a bar 2 in which the front and back end facets are exposed. The bar 2 is inserted into a slot in a holder 905 so that a reverse surface (substrate side) is faced down, and placed in an MOCVD device. Then, as shown in FIG. 12b, AlGaAs high resistance layers 930A, 930B, and 930C are formed on the front end facet, the back end facet, and a top surface of the layered structure, respectively. At this time, the reverse surface is in contact with the holder 905, so that the AlGaAs high resistance layer is not formed on the reverse surface. The AlGaAs high resistance layers formed on the front and back end facets 930A and 930B function as window layers.

However, the AlGaAs high resistance layer 930C (unwanted growth layer) formed on the top surface of the layered structure increases the resistance of the semiconductor laser device. In particular, when the semiconductor laser device operates at a high output power level, problems arise such as efficiency deterioration and short lifetime because of the increase in resistance of the device. In the case where the bar 2 is inserted into the holder 905 so that the top surface of the layered structure is faced down, an AsGaAs high resistance layer (unwanted growth layer) is formed on the reverse surface, which still increases the resistance of the semiconductor laser device.

In order to prevent the formation of the above-mentioned unwanted growth layer, the top surface of the layered structure or the reverse surface are covered. As shown in FIG. 13a, the bar 2 and a cover 903 are inserted into the slot of the holder 905 which is placed in the MOCVD device. Stock gas is not provided to the underneath of the cover 903, and unwanted growth layer is not formed on the top surface of the layered structure. However, actually, in order to readily insert the bar 2 into the slot, the width of the slot is made relatively larger than that of the bar 2. Because of this, even though the width of the bar 2 and that of the cover 903 are identical, a shift in their relative positions is caused as shown in FIG. 13b. Due to this shift, the AlGaAs layer 930C (unwanted growth layer) is formed on a portion of the internal structure at one side of the end facets. At the other side of the end facets, the cover 903 prevents the flow of the stock gas because of the positional shift between the bar 2 and the cover 903, so that the window layer 930B does not have a uniform thickness. In an extreme case, the window layer 930B may not be formed at all at this side.

To solve this problem, an etching technique has been proposed to remove the unwanted growth layer. However, in this method, because the composition of the window layers is the same as that of the unwanted growth layer, it is necessary to form protective layers against an etchant on the window layers to prevent the window layers from being etched when the unwanted growth layer is etched. After the unwanted growth layer is removed, an additional step of removing the protective layers is required, which increases the number of the steps, and also provides a very complicated process.

On the other hand, in the case where the window layers are grown on the light-emitting end facets, the window layers are generally formed before the formation of electrodes so as to prevent a crystal growing device from being contaminated. In this case, the wafer of the facet is cleaved to form a number of bars so as to expose the light-emitting end facets before the formation of the window layers. Because of this, it is necessary to form the electrodes on the respective bars whose number is several tens to several hundreds times as many as one wafer. Moreover, each bar has a small width, for example, of 400 μm, so that the handling of each bar is complicated. Also, it is necessary to form the electrodes on the very limit of the small width of the bars, and the electrodes are not allowed to be formed toward the end facets thereof. Furthermore, the electrodes need to be formed on the top surface of the layered structure and the reverse surface, each at least once. In general, the electrode's formation should be conducted twice for each surface.

A procedure for forming the electrodes in the semiconductor laser device by forming the electrodes on the respective bars will be described below. As shown in FIG. 14a, the bars 2 are inserted into a holder 901 with grooves for supporting both end facets of the bars 2 so that each top surface of the layered structure is faced up. Then, a mask 902 having openings with a width smaller than that of the bars 2 are placed on the resulting holder 901 as shown in FIG. 14b to fix the holder 901 and the mask 902. Under this condition, the holder 901 is placed in a vacuum deposition machine so that the openings of the mask 902 are faced down (facing a deposition source), and then AuGe/Ni electrodes are formed on the top surfaces of the layered structure of the bars 2 by vapor deposition. After that, the mask 902 and the holder 901 are taken out of the vacuum deposition machine and they are separated from each other. Then the bars 2 are inverted and inserted into the holder 901. After fixing the mask 902, the resulting holder 901 is placed in the vacuum deposition machine so that the openings of the mask 902 are faced down, and AuZn electrodes are formed on the reverse surfaces of the bars 2 by vacuum deposition. After that, the bars 2 are taken out of the holder 901 and heated in a heat treatment furnace at 450° C. for 10 minutes. The bars 2 are inserted into the holder 901 so that each top surface of the layered structure is faced up and the mask 902 is fixed. The resulting holder 901 is placed in the vacuum vapor deposition machine, and Mo/Au electrodes are formed on the AuGe/Ni electrodes by vacuum deposition. The bars 2 placed in the holder 901 are inverted, and then Al electrodes are formed on the AuZn electrodes by vacuum deposition. In this way, the electrodes are formed on the top surface of the layered structure and the reverse surfaces of the bars, other than the end facets thereof.

As described above, the formation of the electrodes on the bars is very complicated. Thus, even though high output semiconductor laser devices in which window layers are formed on cleaved faces (light-emitting end facets) have an advantage of high performance, they become very expensive, preventing their diffusion.

SUMMARY OF THE INVENTION

The method for producing a semiconductor laser device of this invention, in which a layered structure for emitting light is formed on a substrate, the layered structure including an active layer, and window layers made of a semiconductor whose bandgap is larger than that of the active layer are formed on light-emitting end facets of the layered structure, includes the steps of:

forming the window layers made of a semiconductor on either one of a top surface of the layered structure or a reverse surface of the substrate and on the light-emitting end facets of the layered structure;

forming a reflection film and/or an anti-reflection film on the light-emitting end facets;

removing the window layer formed on either one of the top surface of the layered structure or the reverse surface of the substrate by using an etchant which hardly etches the reflection film or the anti-reflection film; and forming electrodes on the surface from which the window layer is removed by etching and on the other surface.

The method for producing a semiconductor laser device of this invention, in which a substrate with a layered structure for light emitting is cleaved into a plurality of bars, the layered structure including an active layer, and the bars are cut into chips, includes the steps of:

forming window layers on light-emitting end facets of the bars;

inserting the bars with the window layers into an apparatus, the apparatus having openings for forming electrodes on top surfaces of the bars and on reverse surfaces thereof and a supporting portion for preventing a positional shift between the bars and the openings; and forming the electrodes on the top surfaces and the reverse surfaces of the bars under the condition that the bars are in the apparatus; and cutting the bars on which the electrodes are formed into the chips.

According to the method of the present invention, the reflection films and/or the anti-reflection films are formed on the light-emitting end facets (front and back end facets) after the formation of semiconductor window layers on the facets and either of the top surface of the layered structure or the reverse surface of the substrate in the semiconductor laser device. The unwanted growth layer which is formed on either one of the top surface of the layered structure or the reverse surface of the substrate is removed by an etching technique. At this time, the reflection films and/or the anti-reflection films play a protective layer's role for the window layers and remain unetched. Also, because these films which are essential in the semiconductor laser device need not be removed, an additional step of removing these films is not required and the process will be more simplified. Moreover, because the unwanted growth layer is removed by an etching technique according to the method of this invention, there is an advantage that the resulting window layer has a uniform thickness while the conventional method for controlling the growth of the unwanted growth layer by covering the surface of the semiconductor laser device provides a window layer with uneven thickness.

On the other hand, according to the method of the present invention, a number of bars formed from a wafer are inserted into an apparatus having openings on its wide faces when the electrodes are formed on the bars. The apparatus can be handled as if it was one wafer. Because of this, the process can be more simplified than in the case where the electrodes are formed on the respective bars. Only two additional steps, i.e., inserting the bars into the apparatus and fixing them therein, and taking the bars out of the apparatus, are required compared to when forming the electrodes on the wafer.

Thus, the invention described herein makes possible the advantage of providing a method for producing a semiconductor laser device with window layers formed on light-emitting end facets, in which the number of the production steps can be decreased.

These and other advantages of the present invention will become apparent to those skilled in the art upon reading and understanding the following detailed description with reference to the accompanying figures.

BRIEF DESCRIPTION OF THE DRAWINGS

FIG. 11 is a cross-sectional view of a semiconductor laser device produced in accordance with Examples 4 and 8.

FIGS. 12a and 12b show a conventional process for forming window layers.

DESCRIPTION OF THE PREFERRED EMBODIMENTS

Hereinafter, the present invention will be described by way of illustrating examples with reference to the drawings.

EXAMPLE 1

Figure 8:
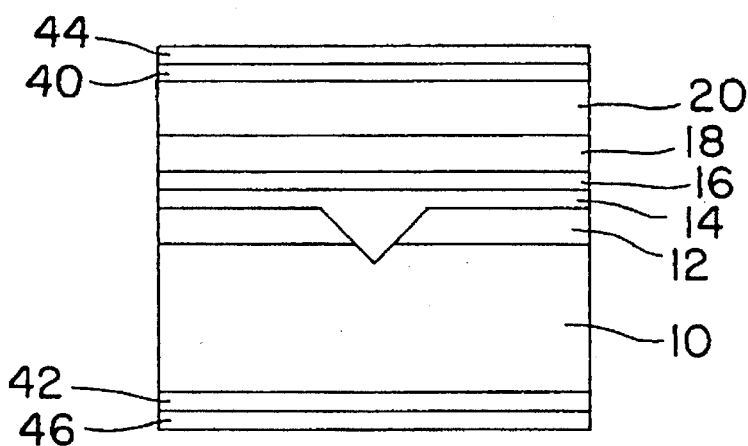
FIG. 8 is a cross-sectional view of a semiconductor laser device produced in accordance with Examples 1 and 5.

In the present example, a step for forming window layers of the present invention is applied to the production of a semiconductor laser device with an internal current blocking structure as shown in FIG. 8.

First, an internal structure of a semiconductor laser device is formed as below.

On a p-type GaAs substrate 10, an n-type GaAs current blocking layer 12 is grown by the LPE method, and a V-shaped groove is formed by etching so as to reach the substrate 10. Then, on the current blocking layer 12, a p-type $Al_{0.45}Ga_{0.55}A$ first cladding layer 14, an undoped $Al_{0.15}Ga_{0.85}As$ active layer 16, and an n-type $Al_{0.45}Ga_{0.55}$ As second cladding layer 18, and an n-type GaAs cap layer 20 are grown by the LPE method.

Figure 1A:
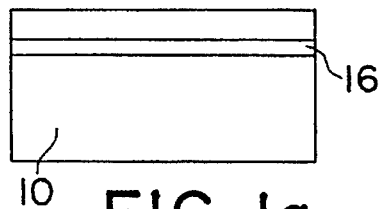
FIG. 1a through 1e are views showing the production of a semiconductor laser device of Example 1.
Figure 1B:
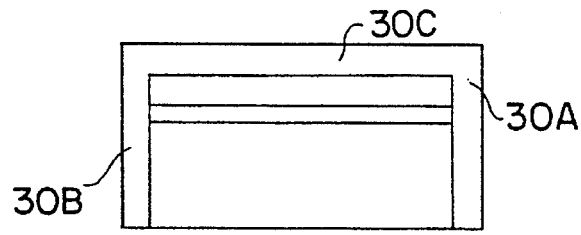

Next, a wafer (12×12×0.1 mm$^3$) with the above-mentioned internal structure (layered structure) is lapped to a thickness of 100 μm. The wafer is cleaved in a vertical direction with respect to the stripe of the laser waveguide, and divided into bars with a width of 400 μm and a length of 12 mm as shown in FIG. 1a. In FIG. 1a, only the active layer 16 is shown as the internal structure. These bars are placed at an appropriate distance from each other on a susceptor in an MOCVD reactor so that each top surface of the layered structure is faced up. $Al_{0.5}Ga_{0.5}As$ high resistance layers 30A, 30B, and 30C (unwanted growth layer), each having a thickness of 0.3 μm are grown on a front end facet, a back end facet, and the top surface of the layered structure of each bar, respectively as shown in FIG. 1b by the MOCVD method. At this time, the bars are placed so that each reverse surface is faced up, and the $As_{0.5}Ga_{0.5}As$ high resistance layer 30C can be grown on the respective reverse surfaces of the bars.

Figure 1C:
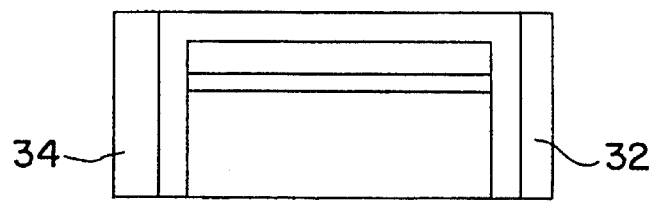

Then, the bars are raised up so that each front end facet is faced down. The bars are placed in contact with each other, and under this condition, an $Al_2O_3$ anti-reflection film 32 with a thickness of 0.11 μm is formed on each front end facet by vacuum deposition. Then, the bars are inverted, and placed in contact with each other; under this condition, an $Al_2O_3/Si/Al_2O_3/Si/Al_2O_3$ high reflectance reflection film 34 is formed on each back end facet by vacuum deposition so that the optical path length of each layer is ¼ of a wavelength of an oscillated laser beam. A cross-sectional view of each bar in this stage is shown in FIG. 1c.

Figure 1D:
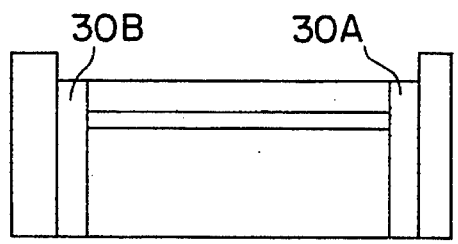
Figure 2:
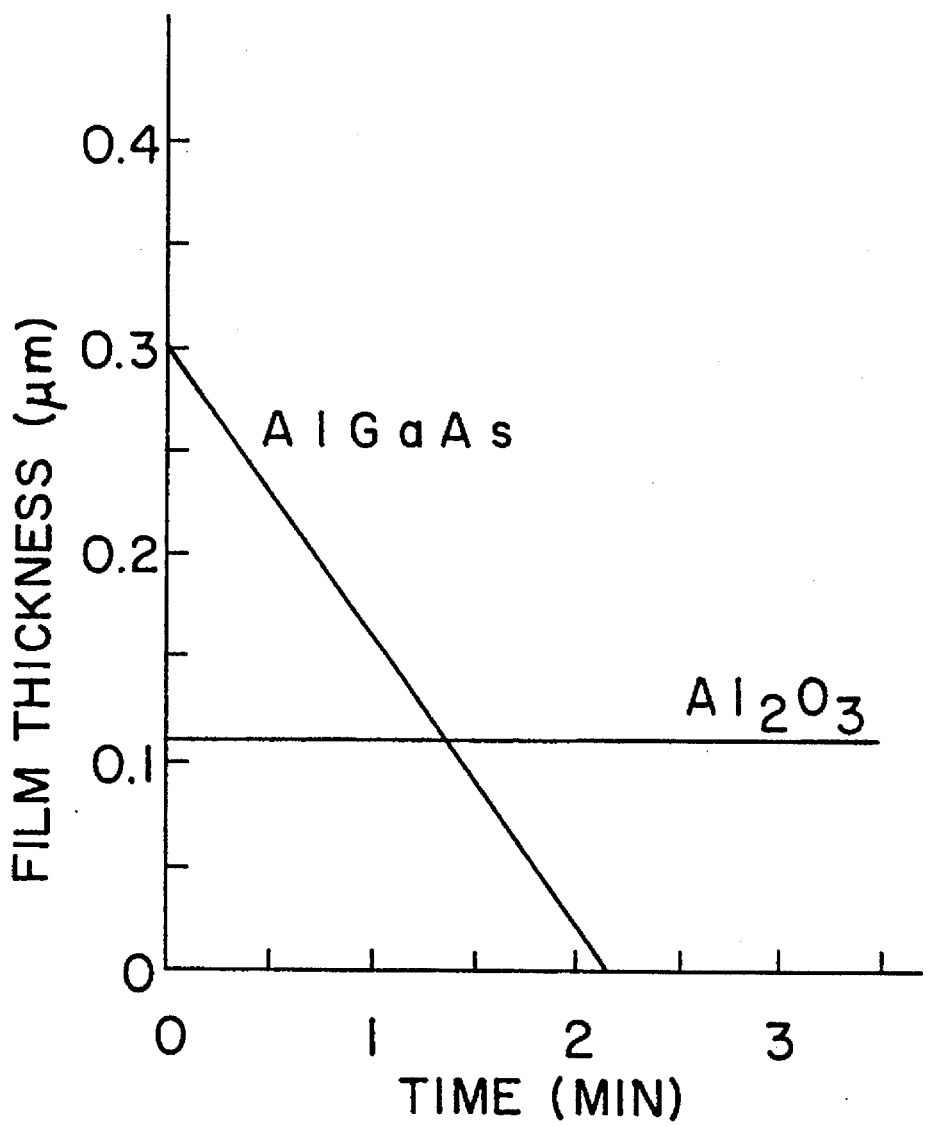
FIG. 2 is a graph showing the relationship between the etchant soaking time and the thickness of a film according to Example 1.

Each bar so obtained is soaked in an etchant with a component ratio of sulfuric acid:hydrogen peroxide: water= 2:4:100. Because of this, as shown in FIG. 1d, the $Al_{0.5}Ga_{0.5}As$ layer 30C is removed. At the same time, the reverse surface of the substrate 10 is slightly etched. In contrast, $Al_2O_3$ contained in the outermost portion of the anti-reflection film 32 and the reflection film 34 is hardly etched. FIG. 2 shows a relationship between the etchant soaking time and the remaining film thickness in the case where the $Al_{0.5}Ga_{0.5}As$ layer 30C has a thickness of 0.3 μm and the anti-reflection film 32 has a thickness of 0.11 μm.

Figure 1E:
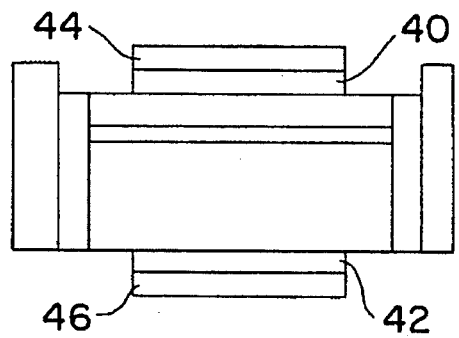
Figure 14A:
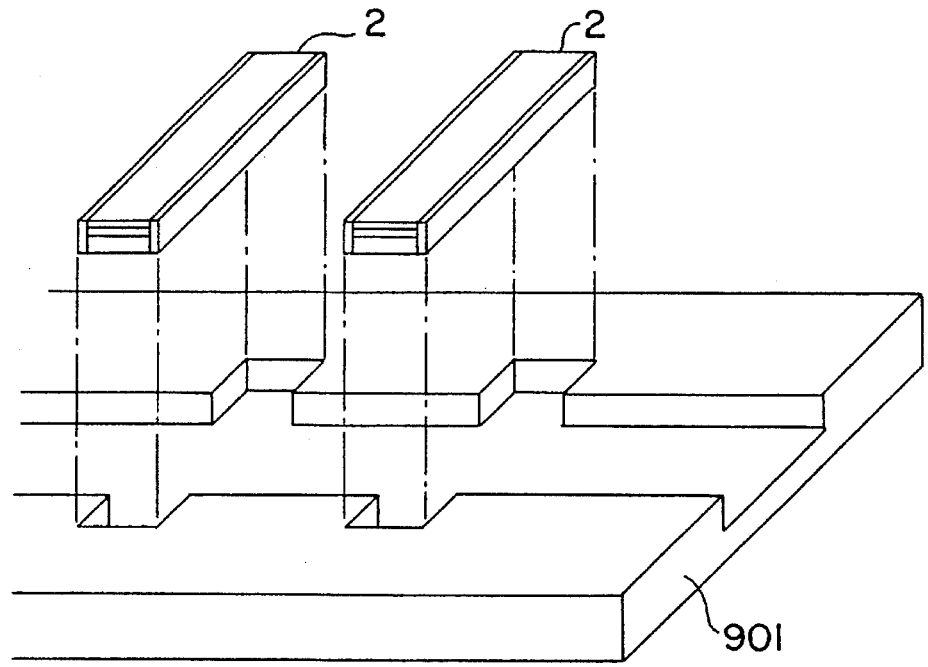
FIGS. 14a and 14b show still another conventional process for forming electrodes.
Figure 14B:
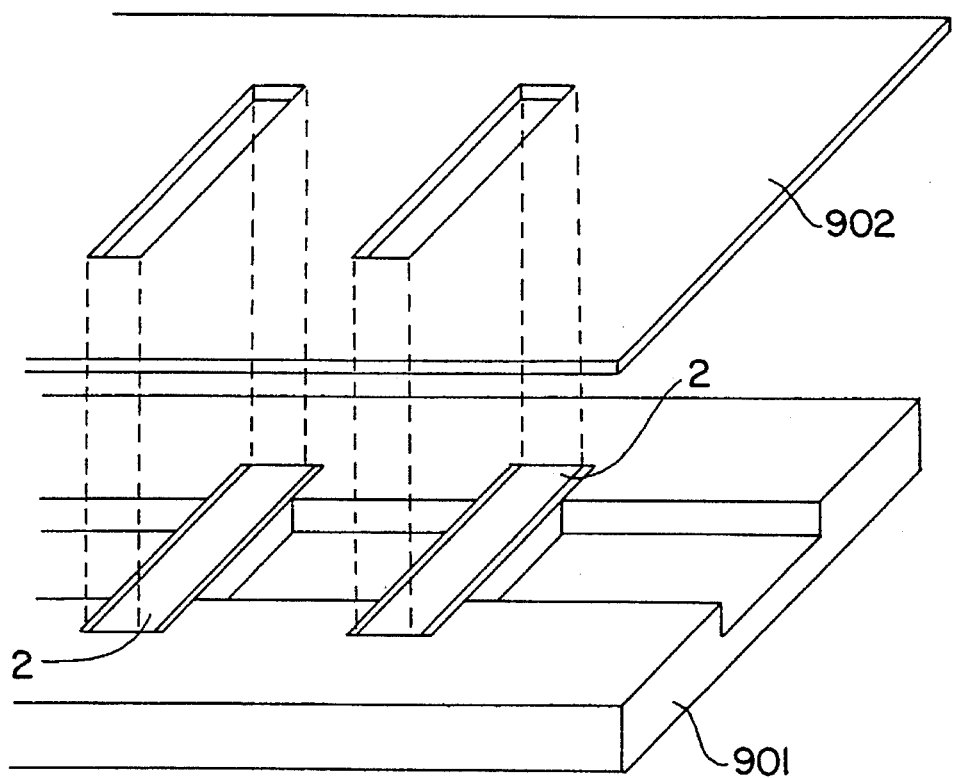

After that, electrodes are formed on the top surface of the layered structure and the reverse surface of the bars excluding portions in the vicinity of the end facets thereof by the process shown in FIGS. 14a and 14b. As shown in FIG. 14a, bars 2 are inserted into a holder 901 with grooves for supporting the end facets of the bars 2 so that each top surface of the layered structure is faced up. Then, a mask 902 with openings having a smaller width than that of the bars 2 is placed on the resulting holder 901, and the holder 901 and the mask 902 are fixed. Under this condition, the holder 901 is placed in a vacuum deposition machine so that the openings of the mask 902 are faced down (facing a deposition source), and then AuGe/Ni electrodes 40 are formed on the top surfaces of the layered structure of the bars 2. The mask 902 and the holder 901 are taken out of the vacuum deposition machine and separated from each other, and the bars 2 are inverted and inserted into the holder 901 again. The holder 901 and the mask 902 are fixed, and AuZn electrodes 42 are formed on the reverse surfaces of the bars 2 by the vacuum deposition as shown in FIG. 1e. After that, the bars 2 are taken out of the holder 901, and heated in a furnace at 450° C. for 10 minutes. The bars 2 are inserted into the holder 901 so that each top surface of the layered structure is faced up, and the mask 902 is fixed to the holder 901. The resulting holder 901 is placed in the vacuum deposition machine and Mo/Au electrodes 44 are formed on the AuGe/Ni electrodes 40. Moreover, the bars 2 in the holder 901 are inverted, and Al electrodes 46 are formed on the AuZn electrodes 42 by vacuum deposition as shown in FIG. 1e. The resulting bar 2 is shown in FIG. 1e.

Each bar on which the electrodes are formed as described above is divided into chips. The chip is die-bonded to a stem so that the top surface of the layered structure is faced down and a wire is bonded to the reverse surface of the chip. The chip is sealed with a cap having a window under nitrogen atmosphere.

This semiconductor laser device oscillates at a wavelength of 780 nm, and its threshold current and maximum optical output are 70 mA and about 320 mW, respectively.

EXAMPLE 2

Figure 9:
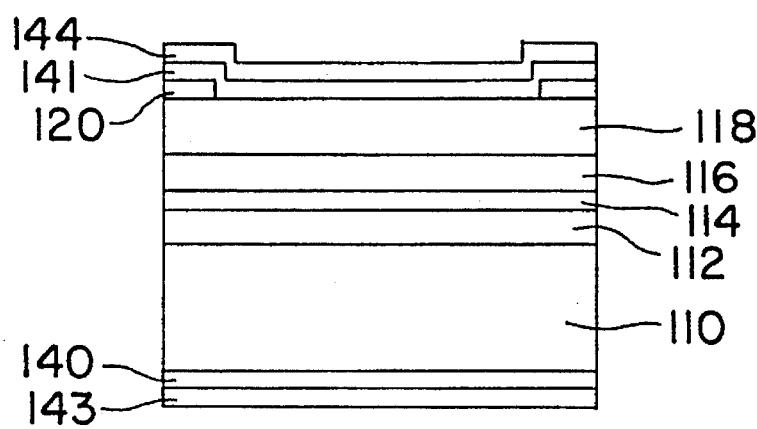
FIG. 9 is a cross-sectional view of a semiconductor laser device produced in accordance with Examples 2 and 6.

In the present example, a step for forming window layers of the present invention is applied to the production of an InGaAlP type broad area laser device as shown in FIG. 9.

First, an internal structure of the semiconductor laser device is formed as below.

On an n-type GaAs substrate 110, an n-type $In_{0.5}Al_{0.5}P$ cladding layer 112, an, undoped $In_{0.5}Ga_{0.5}P$ active layer 114, a p-type $In_{0.5}Al_{0.5}P$ cladding layer 116, and p-type GaAs cap layer 118 are formed by the MOCVD method. Then, an $Si_3N_4$ film 120 is formed over an entire surface of a top surface of the internal structure (layered structure) by the MOCVD method and etched so as to form a stripe opening with a width of 200 μm.

Next, a wafer with the above-mentioned internal structure is lapped to a thickness of 100 μm and is cleaved into bars with a width of 400 μm and a length of 12 mm in the same way as in Example 1. These bars are placed at an appropriate distance from each other on a susceptor in an MOCVD reactor so that each top surface of the layered structure is faced down. $In_{0.5}(Ga_{0.8}Al_{0.2})_{0.5}P$ high resistance layers, each having a thickness of 0.3 μm are grown on a front end facet, a back end facet, and a reverse surface (substrate side) of each bar, respectively in the same way as in Example 1 by the MOCVD method.

Then, the bars are raised up so that each front end facet is faced down. The bars are placed in contact with each other, and under this condition, an $SiO_2$ anti-reflection film is formed on each front end facet by vacuum deposition so that the optical path length (thickness×refractive index) is ¼ of a wavelength of an oscillated laser beam. Then, the bars are inverted, and placed in contact with each other; under this condition, an $SiO_2/TiO_2/SiO_2/TiO_2/SiO_2$ high reflectance reflection film is formed on each back end facet by vacuum deposition so that the optical path length of each layer is ¼ of a wavelength of an oscillated laser beam.

Each bar so obtained is soaked in an etchant in which fluorine and water are mixed. Because of this, the unwanted growth layer (i. e., the $In_{0.5}(Ga_{0.8}Al_{0.2})_{0.5}P$ layer formed on the reverse surface of each bar) is removed.

After that, electrodes are formed on the bars in the same way as in Example 1. First, AuZn electrodes 141 and AuGe/Ni electrodes 140 are formed on the top surfaces of the layered structure and on the reverse surfaces of the bars, respectively. The bars are then heated in a furnace at 450° C. for 10 minutes. Moreover, in the same way as in Example 1, Mo/Au electrodes 144 and 143 are formed by vacuum deposition on the AuZn electrodes 141 and the AuGe/Ni electrodes 140, respectively. The resulting bars are divided into chips and packaged.

The present example describes a gain wave-guide type semiconductor laser device; however, the method for producing a semiconductor laser device of the present invention can be applied to a device in which a stripe width is made narrow and a refractive waveguide mechanism is provided. This type of device has a small diameter of a light converging spot, so that the device is suitable for an optical source for an optical disk or a laser-beam printer.

The semiconductor laser device obtained in the present example oscillates at a wavelength of 670 nm and its threshold current and maximum optical output are 45 mA and 90 mW, respectively.

EXAMPLE 3

Figure 10:
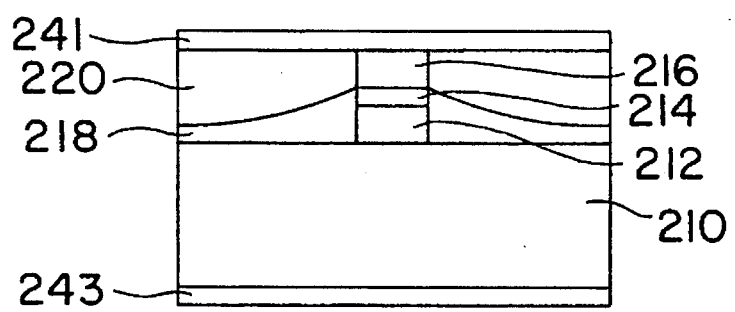
FIG. 10 is a cross-sectional view of a semiconductor laser device produced in accordance with Examples 3 and 7.
Figures 13A, 13B:
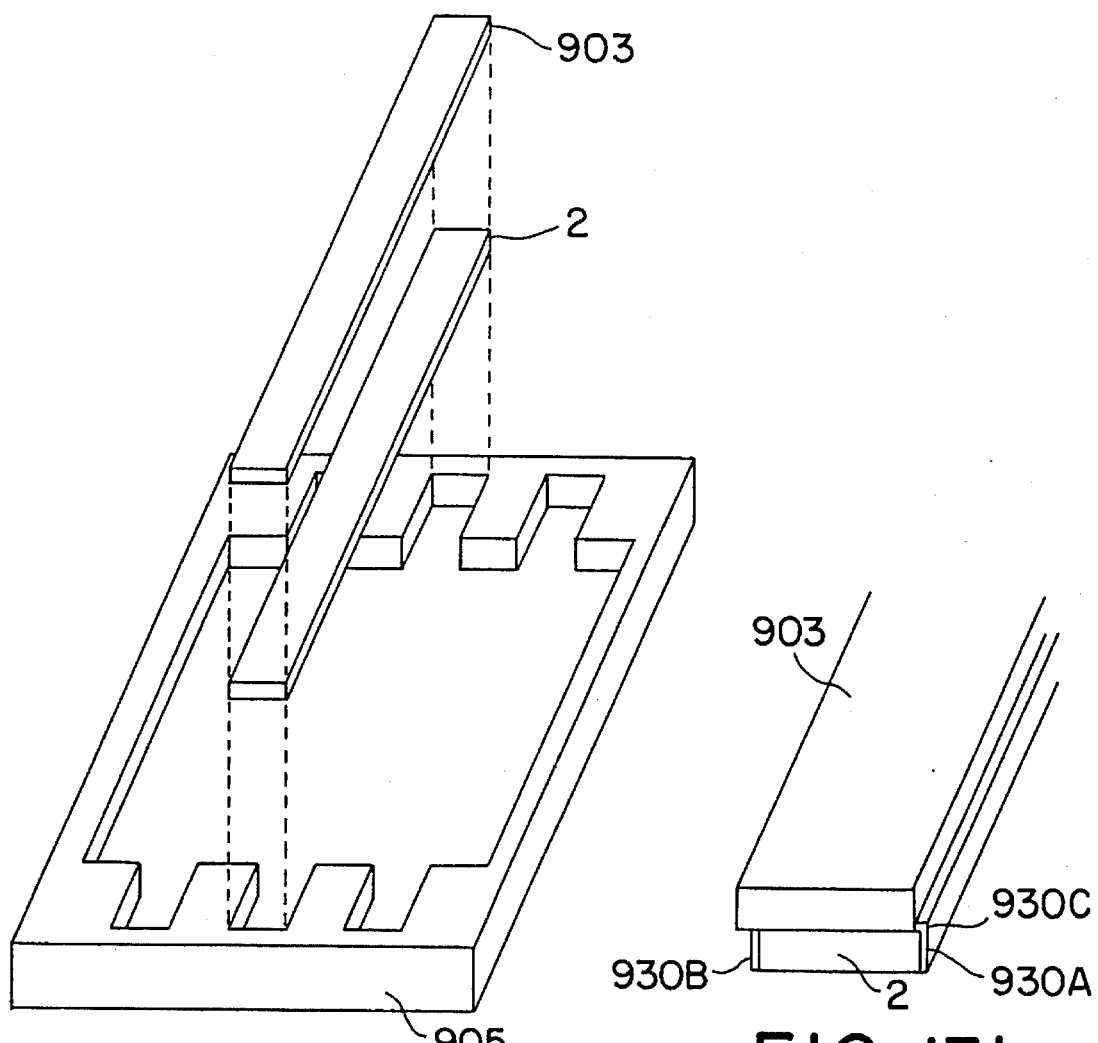
FIGS. 13a and 13b show another conventional process for forming window layers.

In the present example, a step for forming window layers of the present invention is applied to the production of a long wavelength type laser device having an InP substrate as shown in FIG. 10.

First, an internal structure of the semiconductor laser device is formed as below.

On an n-type InP substrate 210, an n-type InP cladding layer 212, an undoped $In_{0.84}Ga_{0.16}P_{0.67}$ active layer 214, and a p-type InP cladding layer 216 are formed by the MOCVD method. The layered structure so obtained is etched so as to reach the substrate 210 so that a stripe region remains. Then, the stripe region is buried by a p-type InP layer 218 and an n-type InP layer 220 so that the stripe region is not filled with these layers 218 and 220.

Next, a wafer with the above-mentioned internal structure is lapped to a thickness of 100 μm and is cleaved into bars with a width of 300 μm and a length of 12 mm in the same way as in Example 1. These bars are placed at an appropriate distance from each other on a susceptor in an MOCVD reactor so that each top surface of the layered structure is faced up. Undoped InP layers, each having a thickness of 0.5 μm are grown by the MOCVD method on a front end facet, a back end facet, and the top surface of the layered structure of each bar, respectively in the same way as in Example 1.

Then, the bars are raised up so that each front end facet is faced down. The bars are placed in contact with each other, and under this condition, an $Al_{2}O_{3}$ anti-reflection film is formed on each front end facet by vacuum deposition so that the optical path length is ¼ of a wavelength of an oscillated laser beam. Then, the bars are inverted, and placed in contact with each other; under this condition, an $Al_{2}O_{3}/Si/Al_{2}O_{3}$ reflection film is formed on each back end facet by vacuum deposition so that the optical path length of each layer is ¼ of a wavelength of an oscillated laser beam.

Each bar so obtained is soaked in an etchant with a component ratio of ammonia:hydrogen peroxide:water= 1:50:50. Because of this, the unwanted growth layer (i.e., the undoped InP layer formed on the top surface of the layered structure of each bar) is removed.

After that, in the same way as in Example 1, p-sided electrodes 241 and n-sided electrodes 243 are formed on the top surfaces of the layered structure and on the reverse surfaces of the bars, respectively. The bars so obtained are subjected to heat treatment. The bars are divided into chips and packaged.

The semiconductor laser device obtained in the present example oscillates at a wavelength of 1.51 μm and its threshold current is 35 mA. The InP type laser has an optical output large enough to destroy end facets thereof. However, according to the present example, the window layers are provided on the light-emitting end facets, whereby the device can afford an optical output of 80 mW without damaging the end facets and with reliability for a long period of time. Thus, it is advantageous to use this type of laser for long distance transmission.

EXAMPLE 4

In the present example, a step for forming window layers of the present invention is applied to the production of an InGaAs strained quantum well laser device as shown in FIG. 11.

First, an internal structure of the semiconductor laser device is formed as below.

On an n-type GaAs substrate 310, an n-type $Al_{0.5}Ga_{0.5}As$ cladding layer 312, an n-type $Al_xGa_{1-x}As$ cladding layer 314 (in which a crystal composition ratio x is gradually changed from 0.5 to 0), an undoped $In_{0.2}Ga_{0.8}As$ strained quantum well active layer 316 with a thickness of 100 Å, a p-type $Al_xGa_{1-x}As$ cladding layer 318 (a crystal composition ratio x is gradually changed from 0 to 0.5), a p-type $Al_{0.5}Ga_{0.5}As$ cladding layer 320, and a p-type GaAs cladding layer 322 are formed by the MBE method. The p-type cladding layer 320 and the p-type cap layer 322 are etched so as to give a mesa structure with a width of 3 μm. The mesa structure excluding a surface of the p-type cap layer 322 is covered with an $Si_3N_4$ layer 324. Here, InGaAs used for the strained quantum well active layer 316 is not lattice-matched with the GaAs substrate 310, causing the strain. However, because the thickness of the layer 316 is very, thin, crystal without lattice defects can be grown in spite of the strain in the crystal.

Next, a wafer with the above-mentioned internal structure is lapped to a thickness of 100 μm and is cleaved into bars with a width of 300 μm and a length of 12 mm in the same way as in Example 1. These bars are placed at an appropriate distance from each other on a susceptor in an MOCVD reactor so that each top surface of the internal structure (layered structure) is faced up. Undoped GaAs layers, each having a thickness of 0.5 μm are grown on a front end facet, a back end facet, and the top surface of the layered structure of each bar, respectively in the same way as in Example 1 by the MOCVD method.

Then, the bars are raised up so that each front end facet is faced down. The bars are placed in contact with each other, and under this condition, an $Si_3N_4$ anti-reflection film is formed on each front end facet by vacuum deposition so that the optical path length is ¼ of a wavelength of an oscillated laser beam. Then, the bars are inverted, and placed in contact with each other; under this condition, an $Si_3N_4/Si/Si_3N_4/Si_3N_4$ reflection film is formed on each back end facet by vacuum deposition so that the optical path length of each layer is ¼ of a wavelength of an oscillated laser beam.

Each bar so obtained is soaked in an etchant with a component ratio of sulfuric acid:hydrogen peroxide: water= 2:4:100. Because of this, the unwanted growth layer (i.e., the undoped CaAs layer formed on the top surface of the layered structure of each bar) is removed.

After that, in the same way as in Example 1, n-sided electrodes 341 and p-sided electrodes 343 are formed on the top surfaces of the layered structure and the reverse surfaces of the bars. The bars so obtained are subjected to heat treatment. The resulting bars are divided into chips and packaged.

This semiconductor laser device oscillates at a wavelength of 0.98 μm, so that it is suitable for an optical source for oscillation of an Er-doped fiber. Moreover, a semiconductor laser device with a wavelength in the range of 0.9 to 1.1 μm can be produced by varying the crystal composition ratio and thickness of the InGaAs layer 316. In the semiconductor laser device of the present example, the threshold current is 30 mA and the maximum optical output is 120 mW.

EXAMPLE 5

In the present example, a step for forming electrodes of the present invention is applied to the production of a semiconductor laser device having an internal current blocking structure which is similar to that in Example 1.

First, in the same way as in Example 1, an internal structure of the semiconductor laser device is formed.

A wafer with the internal structure (layered structure) so formed is lapped to a thickness of 100 μm and is cleaved into bars with a width of 400 μm and a length of 12 mm in the same way as in Example 1. These bars are placed at an appropriate distance from each other on a susceptor in an MOCVD reactor so that each top surface of the layered structure is faced up. The top surface of the layered structure is covered with a mask, and under this condition, $Al_{0.5}Ga_{0.5}As$ high resistance window layers 30A and 30B, each having a thickness of 0.2 μm are grown on a front end facet and a back end facet of each bar, respectively by the MOCVD method.

Figure 4:
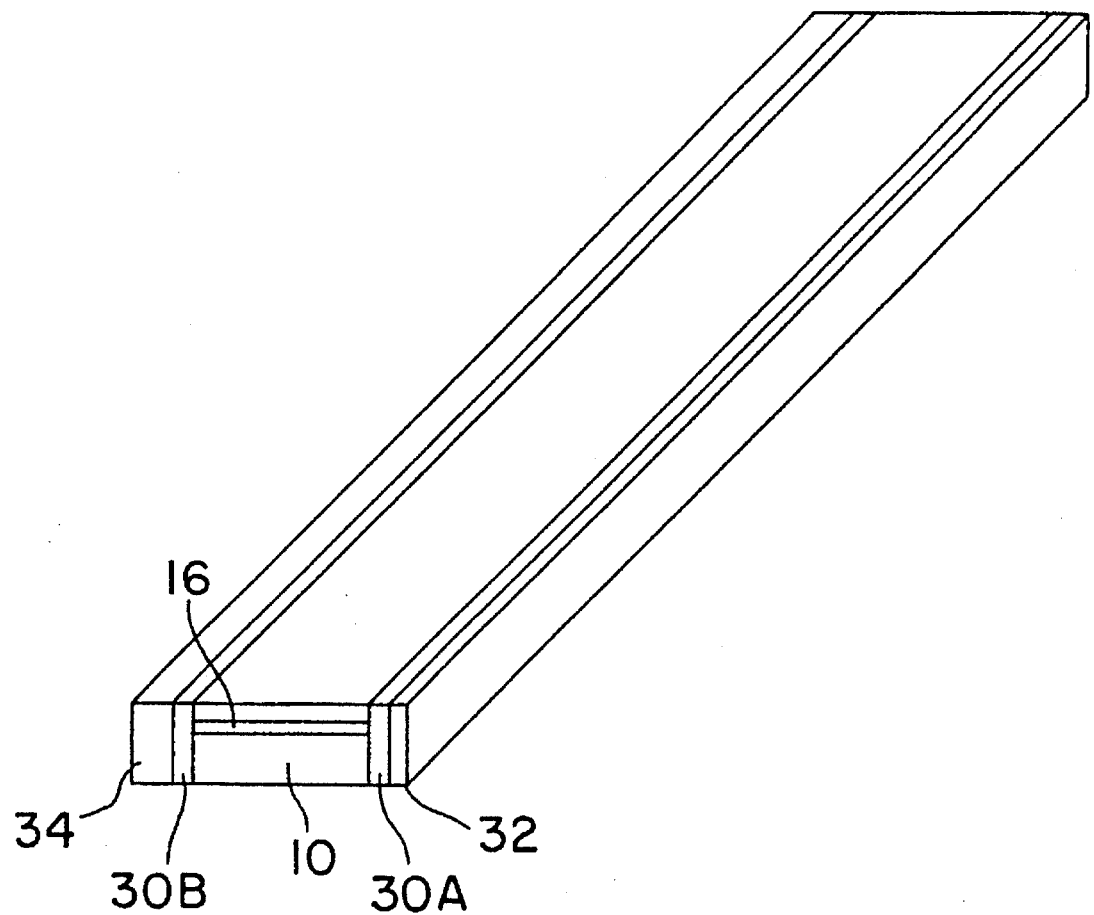
FIG. 4 is a view showing a semiconductor laser bar in Example 5.

Then, the bars are raised up so that each front end facet is faced down. The bars are placed in contact with each other, and under this condition, an $Al_2O_3$ anti-reflection film 32 is formed on each front end facet by vacuum deposition. Then, the bars are inverted, and placed in contact with each other; under this condition, an $Al_2O_3/Si/Al_2O_3$ reflection film 34 is formed on each back end facet by vacuum deposition. A cross-sectional view of each bar in this stage is shown in FIG. 4 (only active layer 16 is shown as the internal structure).

Figure 3:
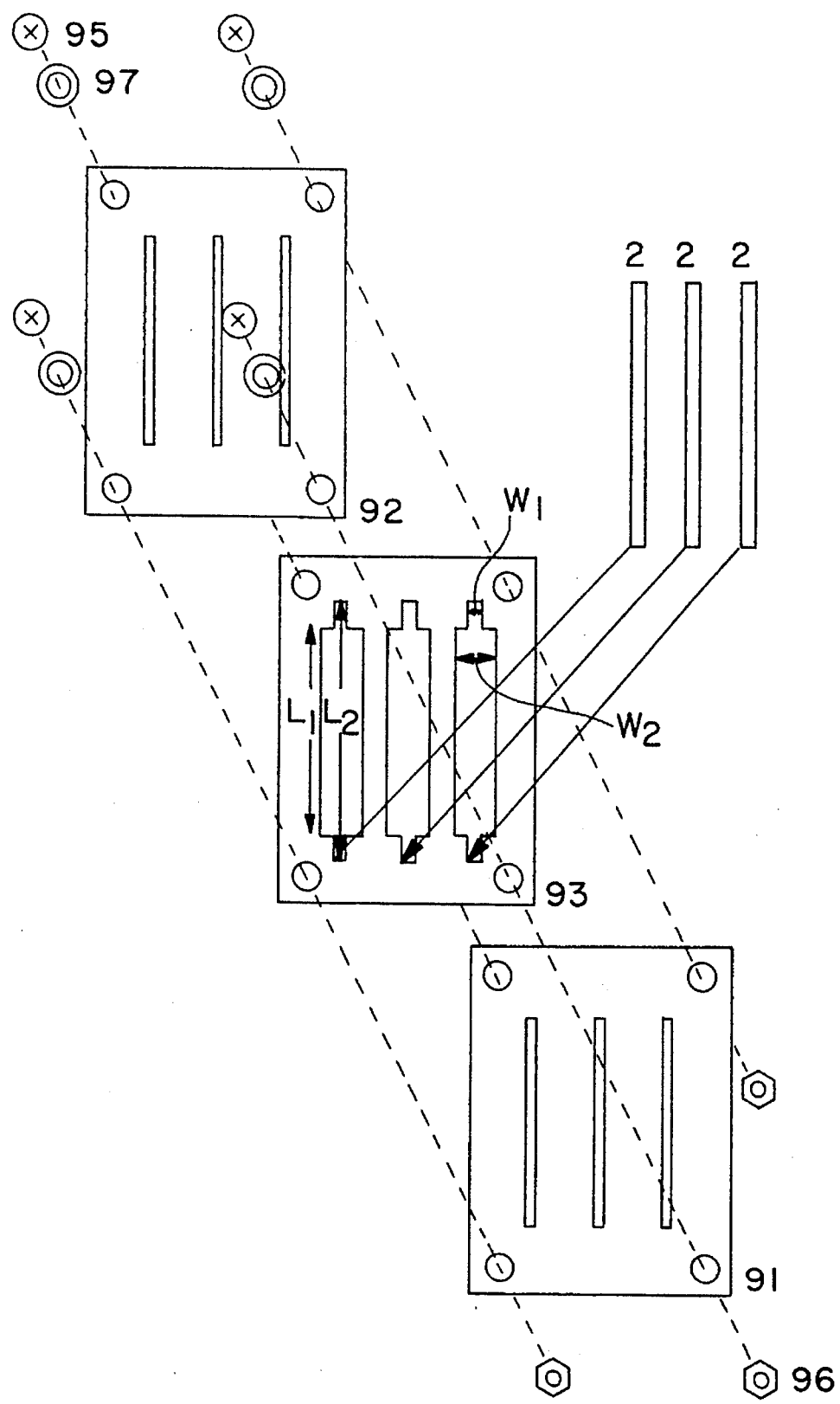
FIG. 3 is a view illustrating a process for forming electrodes in Example 5.

After that, as shown in FIG. 3, a metallic holder 93 is pressed onto a metallic mask 91 so that their positions are aligned with each other. The metallic mask 91 has openings with a width and a length corresponding to an area for forming an electrode. The metallic holder 93 has openings with grooves for supporting both end facets of the bars 2. The bars 2 are inserted into the openings of the holder 93 so that each top surface of the layered structure is faced down. A metallic mask 92 is placed on the holder 93 so as to be aligned therewith. The metallic mask 92 has openings with a width and a length corresponding to an area for forming an electrode. The mask 91, holder 93, and mask 92 are fixed by using screws 95, nuts 96 and washers 97 (hereinafter, a set of these parts assembled is referred to as a mask set).

In the present example, the mask set is as follows:

Mask 91:

thickness 100 μm width of opening 380 μm length of opening 10 mm

Holder 93:

thickness 100 μm width (w1) of groove 410 μm length (L2) of opening including grooves 1 mm width (w2) of opening 1000 μm length (L1) of opening without grooves 10.2 mm Mask 92:

thickness 100 μm width of opening 380 μm length of opening 10 mm

Next, the mask set is placed in a vacuum deposition machine so that the mask 91 is on the underside, and under this condition, AuGe/Ni electrodes 40 are formed on the top surfaces of the layered structure of the bars 2 by vacuum deposition as shown in FIG. 8. The mask set is inverted, and under this condition, AuZn electrodes 42 are formed on the reverse surfaces of the bars 2 by vacuum deposition. Then, the mask set having the bars 2 is put in a furnace and heated at 450° C. for 10 minutes. Moreover, the mask set is placed so that the mask 91 is on the underside, and under this condition, Mo/Au electrodes 44 are formed on the AuGe/Ni electrodes 40 by vacuum deposition. Then, the mask set is inverted and Al electrodes 46 are formed on the AuZn electrodes by vacuum deposition.

After that, the screws 95, nuts 96, washers 97 and the mask 92 are removed. Each bar 2 is taken out of the holder 93 and divided into chips. The chip is die-bonded to a stem so that each top surface of the layered structure is faced down and a wire is bonded to the reverse surface of the chip. The chip is sealed with a cap having a window under nitrogen atmosphere.

In the present example, the masks 91 and 92 and the holder 93 are made of stainless steel. Once the mask set is assembled, it can repeatedly be used through the steps of forming electrodes without being disassembled. The mask 91 and the holder 93 can be fixed to each other by using screws instead of pressing. The mask 91 is used for forming the electrodes on the top surfaces of the layered structure; however it can be used for forming the electrodes on the reverse surfaces. In this case, the bars 2 should be inserted into the mask 93 so that each reverse surface is faced down.

Moreover, in the present example, the electrodes are formed after the reflection films and anti-reflection films are formed; however, the reflection films can be formed after the formation of the electrodes. The reflection films and anti-reflection films can be formed on both of the front and back end facets. Furthermore, in this semiconductor laser device, the deterioration of the light-emitting end facets is sufficiently prevented, so that the semiconductor laser device can be sufficiently stable in operating for a long period of time even without forming the reflection films and the anti-reflection films.

In the present example, when the masks 91 and 92 and the holder 93 are completely aligned with each other, electrodes are not formed on a region of 10 micron±5 μm in the vicinity of the end facets of the bar. Even though such a region where electrodes are not formed exists, resistance and current-optical output characteristics of semiconductor laser devices are almost the same as those of semiconductor laser devices without such a region.

The semiconductor laser device of this example oscillates at a wavelength of 780 nm, and its threshold current and maximum optical output are 70 mA and about 320 mW, respectively.

EXAMPLE 6

In the present example, a step of forming electrodes of the present invention is applied to the production of an InGaAlP type broad area laser device which is similar to that of Example 2.

First, an internal structure of the semiconductor laser device is formed in the same way as in Example 2.

A wafer with the above-mentioned internal structure (layered structure) is lapped to a thickness of 100 μm and is cleaved into bars with a width of 400 μm and a length of 12 mm. These bars are placed at an appropriate distance from each other on a susceptor in an MOCVD reactor so that each top surface of the layered structure is faced down. The reverse surface (substrate side) is covered with a mask, and under this condition, $In_{0.5}(Ga_{0.8}Al_{0.2})_{0.5}P$ layers are grown on a front end facet and a back end facet of each bar, respectively.

Figure 5A:
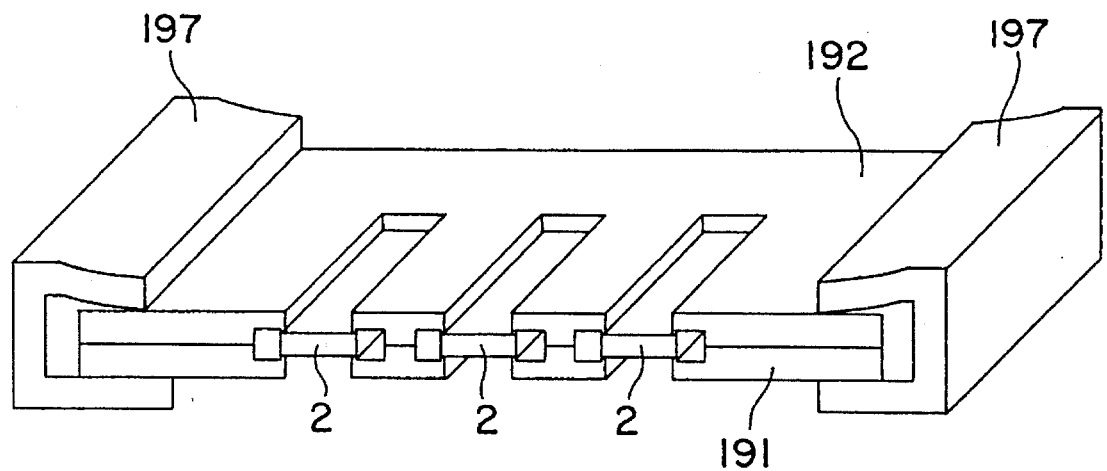
FIGS. 5a and 5b are views illustrating a process for forming the electrodes in Example 6.
Figure 5B:
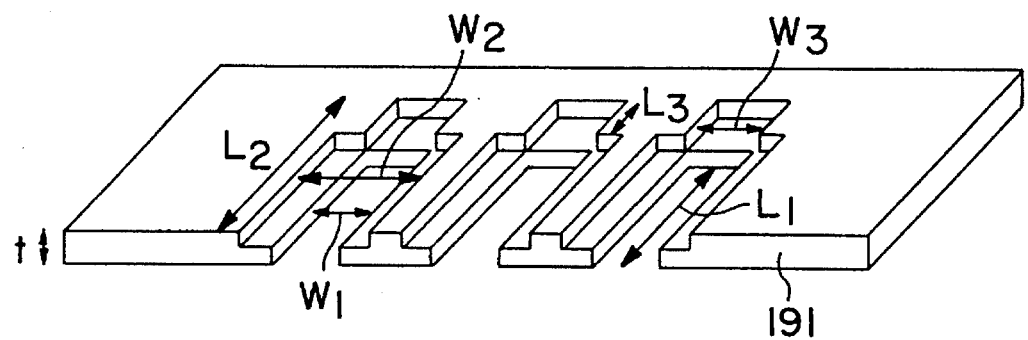

The bars 2 thus obtained are inserted between masks 191 and 192 as shown in FIG. 5a. The mask 191 has openings whose inside (i.e., sides in which the bars 2 are inserted) is larger than the outside thereof as shown in FIG. 5b. The mask 192 also has the same structure as that of the mask 191. Because of this structure, the masks 191 and 192 can firmly support the bars 2. Both of the masks 191 and 192 have the following sizes: t=100 μm, w1=380 μm, L1=10 mm, w2=600 μm, L2=12.2 mm, w3=410 μm, L3=1 mm. The bars 2 are inserted into the mask 191 so obtained is covered with the mask 192. As shown in FIG. 5a, both of the masks 191 and 192 are fixed to each other by using side clips 197 (hereinafter, a set of these parts assembled is referred to as a mask set).

This mask set is placed in a sputtering device so that each top surface of the layered structure of the bars 2 is faced down. AuZn electrodes 141 are formed on the top surfaces of the layered structure by sputtering as shown in FIG. 9. Then, the mask set is inverted, and AuGe/Ni electrodes 140 are formed on the reverse surfaces of the bars 2 by sputtering. The mask set is subjected to heat treatment at 450° C. for 10 minutes. Moreover, the mask set is placed in the sputtering device so that each top surface of the layered structure of the bars 2 is faced down. Mo/Au electrodes 144 are formed on the AuZn electrodes 141 by sputtering. The mask set is inverted, and Al electrodes 143 are formed on the AuGe/Ni electrodes 140 by sputtering. In each sputtering step, a target (i.e., a sputtering source) is placed below the bars 2; however, the target can be placed above the bars 2. In this case, it is necessary to place the mask set in the sputtering device so that the surface to be sputtered is faced up.

After that, the side clips 197 are removed from the mask set and each bar 2 is taken out.

The bars 2 under this condition are raised up so that each front end facet is faced down. The bars are placed in contact with each other, and under this condition, an $SiO_2$ anti-reflection film is formed on each front end facet by vacuum deposition. Then, the bars 2 are inverted, and placed in contact with each other; under this condition, an $SiO_2/TiO_2/SiO_2/TiO_2/SiO_2$ reflection film is formed on each back end facet by vacuum deposition.

The bars 2 so obtained are divided into chips and packaged.

This semiconductor laser device oscillates at a wavelength of 670 nm, and its threshold current and maximum optical output are 150 mA and 880 mW, respectively.

EXAMPLE 7

In the present example, a step for forming electrodes of the present invention is applied to the production of a long wavelength type laser device having an InP substrate which is similar to that in Example 3.

First, the internal structure of a semiconductor laser device is formed in the same way as in Example 3.

Next, a wafer with the internal structure (layered structure) so formed is lapped to a thickness of 100 μm and is cleaved into bars with a width of 300 μm and a length of 12 mm. These bars are placed at an appropriate distance from each other on a susceptor in an MOCVD reactor so that each top surface of the layered structure is faced down. The reverse surface (substrate side) is covered with a mask, and under this condition, InP high resistance layers are grown by the MOCVD method on a front end facet and a back end facet, respectively.

Then, the bars are raised up so that each front end facet is faced down. The bars are placed in contact with each other, and under this condition, an $Al_2O_3$ anti-reflection film is formed on each front end facet by vacuum deposition. Then, the bars are inverted, and placed in contact with each other; under this condition, an $Al_2O_3/Si/Al_2O_3$ reflection film is formed on each back end facet by vacuum deposition.

Figure 6:
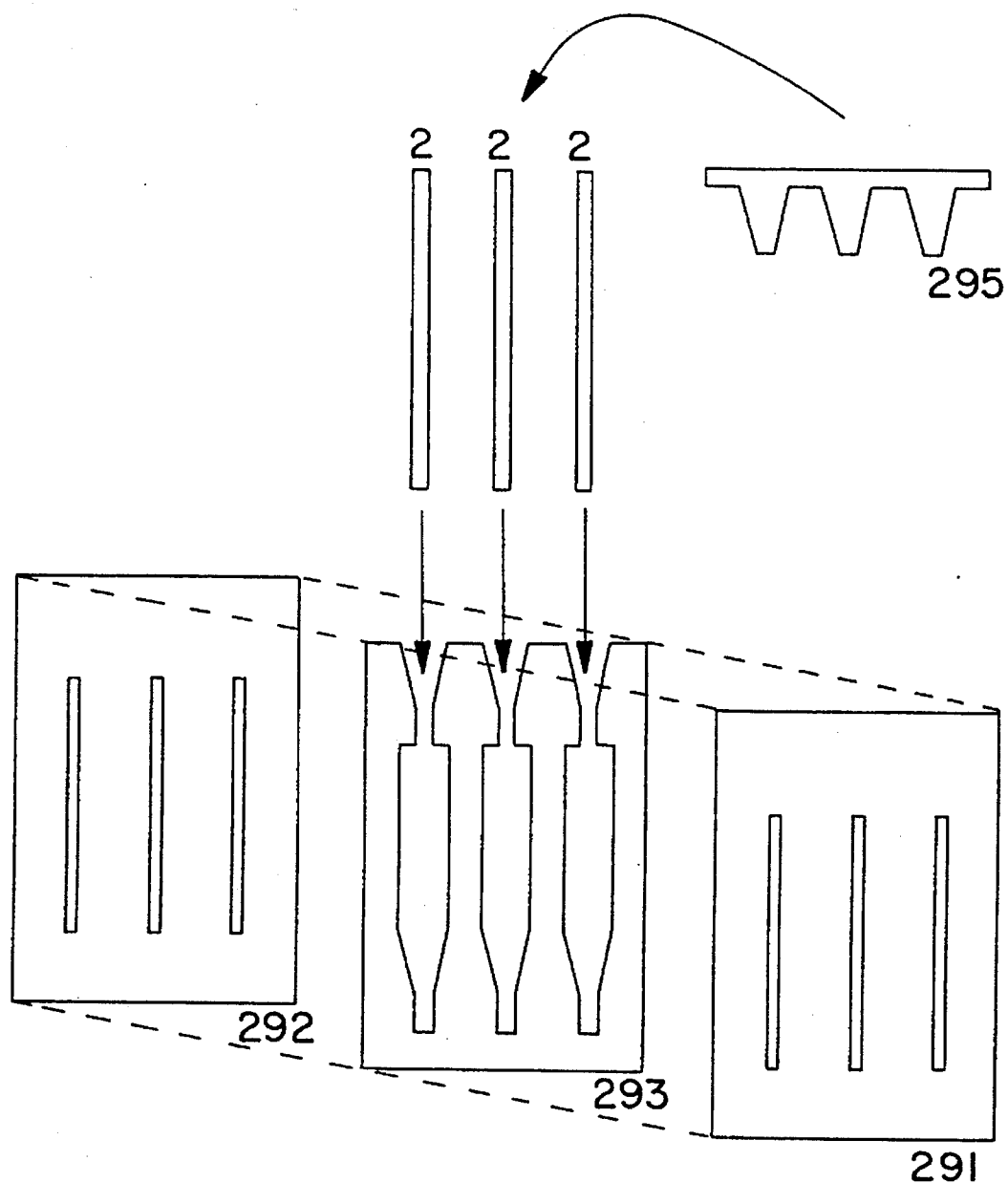
FIG. 6 is a view illustrating a process for forming the electrodes in Example 7.

After that, electrodes are formed by using an apparatus as shown in FIG. 6.

The apparatus includes a holder 293 for supporting bars, masks 291 and 292, each being pressed to each other. The holder 293 has openings whose one end is tapered so as to allow the bars 2 to be inserted therefrom. As shown in FIG. 6, the apparatus is placed so that the tapered portions of the holder 293 are faced up. Then, the bars 2 are dropped into the openings by their own weight, whereby the bars 2 are inserted into the holder 293 with good precision. The openings are covered with a lid 295 so that the bars 2 are not dropped out of the holder 293.

The apparatus is placed in a vacuum deposition machine so that each top surface of the layered structure of the bars 2 is faced down. Then, AuZn electrodes 241 are formed on the top surfaces of the layered structure by vacuum deposition. The apparatus is inverted, and AuGe/Ni electrodes 243 are formed on the reverse surface of the bars 2. After that, the apparatus including the bars 2 is subjected to heat treatment at 450° C. for 10 minutes. The lid 295 is removed from the holder 293, and each bar 2 is taken out.

The bars 2 so obtained are divided into chips and packaged.

This semiconductor laser device oscillates at a wavelength of 1.51 μm and its threshold current is 30 mA. This semiconductor laser device can afford an optical output of 80 mW with reliability for a long period of time, so that it is advantageous for long distance transmission.

EXAMPLE 8

In the present example, a step for forming electrodes of the present invention is applied to the production of an InGaAs strained quantum well laser device which is similar to that in Example 4.

First, the internal structure of the semiconductor laser device is formed in the same way as in Example 4.

Next, a wafer with the internal structure (layered structure) so formed is lapped to a thickness of 100 μm and is cleaved into bars with a width of 300 μm and a length of 12 mm. These bars are placed at an appropriate distance from each other on a susceptor in an MOCVD reactor so that each top surface of the layered structure is faced down. Undoped GaAs layers are grown on a front end facet and a back end facet of each bar, respectively by the MBE method.

Then, the bars are raised up so that each front end facet is faced down. The bars are placed in contact with each other, and under this condition, an $Si_3N_4$ anti-reflection film is formed on each front end facet by the CVD method. Then, the bars are inverted, and placed in contact with each other; under this condition, an $Si_3N_4/Si/Si_3N_4/Si_3N_4$ reflection film is formed on each back end facet by the CVD method.

Figure 7A:
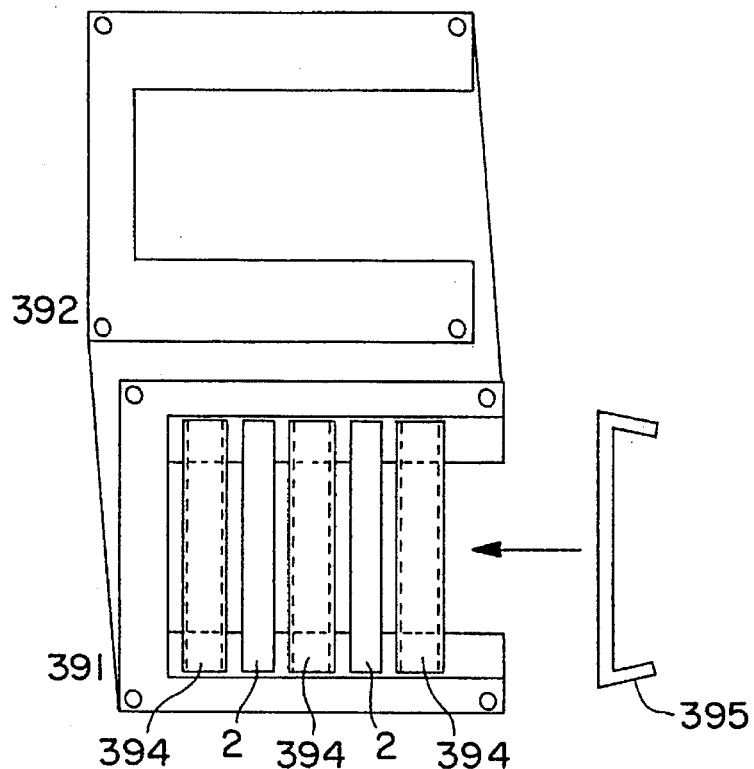
FIGS. 7a through 7c are views showing a process for forming the electrodes in Example 8.
Figure 7B:
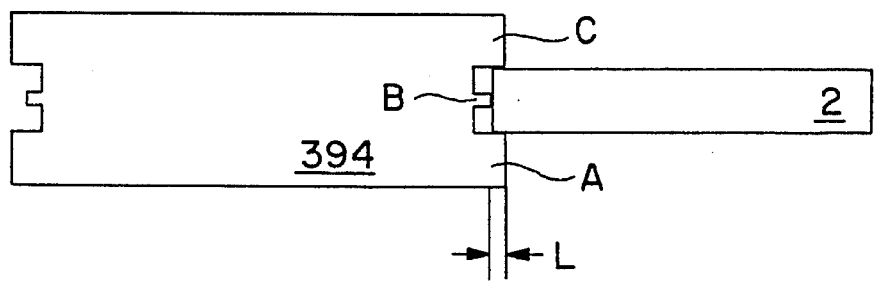
Figure 7C:
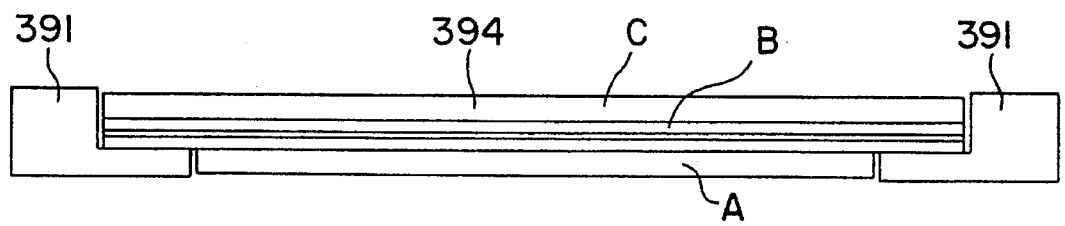

Electrodes are formed by using an apparatus as shown in FIG. 7a. The apparatus includes members 394, and supporting members 391 and 392, and an elastic plate 395. The members 394 are placed so as to sandwich the bars 2 and to cover the vicinity of the light-emitting end facets of the bars 2. The supporting members 391 and 392 support the members 394 and the bars 2. First, as shown in FIG. 7a, the members 394 and the bars 2 are alternately placed at a slight distance from each other in the supporting member 391, and then the supporting member 392 is attached to the supporting member 391. The elastic plate 395 is pushed into the supporting members 391 and 392 so that the members 394 are pressed against the bars 2 so that no gaps are formed therebetween. Each member 394 has a cross section as shown in FIG. 7b and prevents electrodes from being formed around the end facets by projections A and C. Moreover, the member 394 has a small projection B between the projections a and C, the projection B being in contact with a center portion of each end facet of the bars 2, whereby the member 394 is prevented from being in direct contact with light-emitting portions on each end facet of the bars 2. Both ends of each member 394, which come into contact with the supporting member 391 are partially cut away as shown in FIG. 7c, whereby the member 394 and the supporting member 391 are fixed to each other and the member 394 and the bar 2 are also fixed to each other. Under this condition, AuZn electrodes 341 are formed on the top surfaces of the layered structure of the bars 2. Then the apparatus is inverted and AuGe/Ni electrodes 343 are formed on the reverse surfaces of the bars 2. The apparatus including the bars 2 is subjected to heat treatment at 450° C. for 10 minutes. After that, the bars 2 are taken out of the apparatus and divided into chips, followed by being packaged.

According to the method for forming the electrodes in the present example, even bars with different widths can be produced by using the same apparatus. The size of a region where the electrodes are not formed can be almost exactly determined by a difference L between the tip end of the projection C and the tip ends of the projections A and C. In the present example, L is 10 μm, so that a region with a size of 10 μm where the electrodes are not formed is provided in the vicinity of each end facet of the bars 2. Even though such a region where the electrodes are not formed exists, resistance and current-optical output characteristics in semiconductor laser devices are almost the same as those of semiconductor laser devices without regions where the electrodes are not formed.

This semiconductor laser device oscillates at a wavelength of 0.98 μm, so that it is suitable for a light source for the oscillation of an Er-doped fiber. Moreover, a semiconductor laser device with a wavelength in the range of 0.9 to 1.1 μm can be produced by varying a crystal composition ratio and thickness of the InGaAs layer 316. The semiconductor laser device in the present example has a threshold current of 30 mA and a maximum output of 120 mW.

In Examples 5 to 8, any materials can be used for the apparatus as long as they can be processed with high precision and are stable in the course of the formation of the electrodes. Examples of the material include metallic materials such as stainless steel, brass, and aluminum; and semiconductors such as Si, GaAs, and InP; and dielectric substances such as AlN, BN, and carbon.

In the present invention, as materials for forming the window layers, a material selected from the group consisting of AlGaAs, InGaAlP, and InGaAsP can be used.

In Examples 1 to 4, semiconductor laser devices can be produced in a simplified method with a reduced number of steps by forming the electrodes in the similar step to those in Examples 5 to 8. Moreover, in Examples 5 to 8, the quality of semiconductor laser devices can remarkably be improved by using a method for removing the unwanted growth layer as shown in Examples 1 to 4.

AS is apparent from the above description, an unwanted growth layer which is formed in the production of a high output semiconductor laser device with window layers on light-emitting end facets thereof can be removed without increasing the number of steps according to the method of the present invention. Since the unwanted growth layer is removed by an etching technique, it is not required to cover the internal structure growth surface and the reverse surface. Thus, the resulting window layer has a uniform thickness.

Furthermore, electrodes are formed on a number of bars fixed on an apparatus at the same time because these bars are treated as one wafer. Therefore, the process is more simplified compared to the case where the electrodes are formed on the respective bars.

Thus, according to the method of the present invention, semiconductor laser devices with window layers on light-emitting end facets, which have excellent characteristics, can be produced at a lower cost. When these devices are used, they result in high performance and low price of various kinds of appliances.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor laser device in which a substrate with a layered structure for light emitting is cleaved into a plurality of bars, the layered structure including an active layer, and the bars are cut into chips, comprising the steps of:

forming window layers on light-emitting end facets of the bars;

holding the bars with the window layers into a holding portions of top surfaces and reverse surfaces of the bars, the portions being adjacent to the window layers, and for fixing the bars therewith, and forming the electrodes on the remaining portions of the top surfaces and the reverse surfaces of the bars under the condition that the bars are kept in the holding and masking means without being disassembled through the electrodes forming process; and cutting the bars on which the electrodes are formed into the chips, wherein the holding and masking means includes a first mask and a second mask each having through openings whose insides are larger on one side thereof than on the other side thereof, and the bars are inserted within spaces formed by both of the insides of the through openings of the first mask and the second mask.

2. A method for producing a semiconductor laser device in which a substrate with a layered structure for light emitting is cleaved into a plurality of bars, the layered structure including an active layer, and the bars are cut into chips, comprising the steps of:

forming window layers on light-emitting end facets of the bars;

holding the bars with the window layers into a holding and masking means for masking the window layers and portions of top surfaces and reverse surfaces of the bars, the portions being adjacent to the window layers, and for fixing the bars therewith, and forming the electrodes on the remaining portions of the top surfaces and the reverse surfaces of the bars under the condition that the bars are kept in the holding and masking means without being disassembled through the electrodes forming process; and cutting the bars on which the electrodes are formed into the chips, wherein the holding and masking means comprises a first member, a second member, and third bar members, each of the third members having first projections on two parallel side faces to form grooves in the side faces, and the bars and the third bar members are alternately placed between the first and second members so that the window layers and the portions adjacent to the window layers of the bars are inserted in the groove of the third bar members.

3. A method for producing a semiconductor laser device according to claim 2, wherein the third bar members further include second projections in the grooves, the window layers of the bars are in contact with the second projections.

4. A method for producing a semiconductor laser device in which a substrate with a layered structure for light emitting is cleaved into a plurality of bars, the layered structure including an active layer, and the bars are cut into chips, comprising the steps of:

forming window layers on light-emitting end facets of the bars and on one of a top surface of the layered structure and a reverse surface of the substrate;

forming a reflection film and/or an anti-reflection film on the light-emitting end facets;

removing the window layer formed on one of the top surface of the layered structure and the reverse surface of the substrate by selectively etching the window layers using the reflection film and/or the anti-reflection film as a mask;

holding the bars with the window layer separately into a holding and masking means for masking the window layers and portions of top surfaces and reverse surfaces of the bars, the portions being adjacent to the window layers, and for fixing the bars therewith, and forming the electrodes on the remaining portions of the top surfaces and the reverse surfaces of the bars under the condition that the bars are kept in the holding and masking means without being disassembled through the electrodes forming process; and cutting the bars on which the electrodes are formed into the chips.

5. A method for producing a semiconductor laser device comprising the steps of:

cleaving a substrate with a layered structure including an active layer for a light emission into a plurality of bars, the bars each having a top surface, a reverse surface and light-emitting end facets;

covering the light-emitting end facets of the bars with window layers;

holding the bars by sandwiching edge portions of the top surface and the reverse surface of each of the bars directly by a means for masking the window layers;

forming electrodes on exposed portions of the top surface and the reverse surface of each of the bars, by using a thin film deposition method, with the window layers masked by the masking means;

removing the masking means from the bars; and cutting the bars into a plurality of chips.

6. A method for producing a semiconductor laser device according to claim 5, wherein the masking means is made of a material selected from the group consisting of stainless steel, brass, and aluminum.

7. A method for producing a semiconductor laser device according to claim 5, wherein the masking means is made of a material selected from the group consisting of Si, GaAs, InP.

8. A method for producing a semiconductor laser device according to claim 5, wherein the masking means is made of a material selected from the group consisting of AlN, BN, and carbon.

9. A method for producing a semiconductor laser device according to claim 5, wherein the masking means is made of a material selected from the group consisting of AlGaAs, InAlGaP, and InGaAsP.

* * * * *